United States Patent [19]
Brown et al.

[11] Patent Number: 5,770,504
[45] Date of Patent: Jun. 23, 1998

[54] METHOD FOR INCREASING LATCH-UP IMMUNITY IN CMOS DEVICES

[75] Inventors: Jeffrey S. Brown, Jeffersonville; Robert J. Gauthier, Jr., Burlington; Xiaowei Tlan, Essex Junction, all of Vt.

[73] Assignee: International Business Machines Corporation, Armonk, N.Y.

[21] Appl. No.: 819,615

[22] Filed: Mar. 17, 1997

[51] Int. Cl.⁶ .................................................. H01L 21/336
[52] U.S. Cl. ................ 438/296; 438/221; 438/222; 438/223; 438/433; 438/524; 148/DIG. 40; 148/DIG. 50; 148/DIG. 85; 148/DIG. 86; 257/371; 257/374; 257/520
[58] Field of Search .................... 148/DIG. 85, DIG. 86, 148/DIG. 50; 438/294, 296, 221, 222, 223, 424, 430, 433, 524, 158, 168, 172, 218, 227; 257/371, 374, 520

[56] References Cited

U.S. PATENT DOCUMENTS

| | | | |
|---|---|---|---|
| 4,027,380 | 6/1977 | Deal et al. | 29/571 |
| 4,470,852 | 9/1984 | Ellsworth | 148/1.5 |
| 4,477,310 | 10/1984 | Park et al. | 156/643 |
| 4,578,128 | 3/1986 | Mundt et al. | 148/191 |
| 4,599,789 | 7/1986 | Gasner | 29/571 |
| 4,646,123 | 2/1987 | Lynch et al. | 357/42 |
| 4,647,957 | 3/1987 | Coquin et al. | 357/42 |
| 4,653,177 | 3/1987 | Lebowitz et al. | 29/578 |
| 4,656,730 | 4/1987 | Lynch et al. | 29/571 |
| 4,683,488 | 7/1987 | Lee et al. | 357/42 |
| 4,729,006 | 3/1988 | Dally et al. | 357/42 |
| 4,766,090 | 8/1988 | Coquin et al. | 437/57 |
| 4,947,227 | 8/1990 | Teng | 357/42 |
| 4,963,502 | 10/1990 | Teng et al. | 437/41 |
| 5,179,038 | 1/1993 | Kinney et al. | 437/78 |
| 5,420,061 | 5/1995 | Manning | 437/57 |
| 5,536,675 | 7/1996 | Bohr | 437/67 |

*Primary Examiner*—John Niebling
*Assistant Examiner*—Long Pham
*Attorney, Agent, or Firm*—Schmeiser, Olsen & Watts; Mark F. Chadurijian, Esq.

[57] ABSTRACT

The preferred embodiment of the present invention overcomes the limitations of the prior art and provides a device and method to increase the latch-up immunity of CMOS devices by reducing the mobility of carriers between the devices. The preferred embodiment uses an implant formed beneath trench isolation between n-channel and p-channel devices. This implant preferably comprises relatively large/heavy elements implanted into the wafer beneath the trench isolation. The implant elements reduce the mobility of the charge carriers. This increases the latch-up holding voltage and thus reduces the likelihood of latch-up. The implants can be formed without the need for additional photolithography masks.

8 Claims, 6 Drawing Sheets

METHOD FOR INCREASING LATCH-UP IMMUNITY IN CMOS DEVICES

BACKGROUND OF THE INVENTION

1. TECHNICAL FIELD

This invention generally relates to semiconductor devices, and more specifically relates to methods and structures to increase latch-up immunity.

2. BACKGROUND ART

As integrated semiconductor devices continue to grow in complexity, there is a constant need to increase the density of the semiconductor devices. This increase in density creates several problems that can cause device failures if not addressed. One such problem is the propensity for semiconductor devices, particularly CMOS devices, to "latch-up." Latch-up is a well known problem caused by unwanted transistor action between elements of the integrated circuit. This unwanted transistor action can be triggered by a wide variety of events, and can cause the semiconductor device to fail.

Latch-up is generally caused by the close proximity of n-channel and p-channel devices in modern CMOS devices. For example, a typical CMOS device fabricated on a p-type substrate would contain a p-channel device fabricated in a n-well (or n-type region) and an n-channel device fabricated in a p-well (or p-type region), with only a short distance between the wells. This structure inherently forms a parasitic lateral bipolar structure (npn) and parasitic vertical bipolar structure (pnp). Under certain biasing conditions the pnp structure can supply base current to npn structure (or vice versa), causing a large current to flow from one well to the other well. This large current can damage the CMOS device.

The propensity for CMOS devices to latch-up has been addressed in several ways. One way involves reducing the "gain" or beta of the transistor (npn and pnp). This generally reduces the propensity of the CMOS device to latch-up by increasing the trigger voltage/current, where the trigger voltage/current is the voltage/current that must be applied to a node to induce latch-up.

Another method in dealing with latch-up is to raise the latch-up holding voltage. The latch-up holding voltage is the lowest stable voltage that can support a large current after latch-up is triggered. By increasing the latch-up holding voltage, the latch-up immunity is increased and the likelihood of the circuit being damaged is decreased. The optimal situation is to have a holding voltage greater than the burn-in voltage, typically 1.5 times the nominal supply voltage (Vdd).

Shallow trench isolation (STI) has been used between the n-channel and p-channel devices to minimize the likelihood of latch-up. However, as device density continues to increase the STI depth tends to decrease. This causes the latch-up holding voltage to be reduced. If the latch-up holding voltage is reduced significantly, i.e., to less than the burn-in voltage, the reliability of the device can be negatively impacted.

Thus, there is a need for improved methods for increasing the latch-up immunity of CMOS devices by increasing the latch-up holding voltage.

DISCLOSURE OF INVENTION

The present invention overcomes the limitations of the prior art and provides a device and method to increase the latch-up immunity of CMOS devices by reducing the mobility of charge carriers between the devices. The preferred embodiment uses an implant formed beneath trench isolation between n-channel and p-channel devices. The implant reduces the mobility of the carriers wich flow from P+ regions to N+ regions and vice versa. This increases the latch-up holding voltage and thus improves the reliability of the technology. The implants can be formed without the need for additional photolithography masks. The advantage of the present invention is to increase the immunity to latch-up without adding undue complexity to the manufacturing process or requiring a larger area on the semiconductor substrate.

The foregoing and other advantages and features of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements.

BEST MODE FOR CARRYING OUT THE INVENTION

The preferred embodiment of the present invention overcomes the limitations of the prior art and provides a device and method to increase the latch-up immunity of CMOS devices by decreasing carrier mobility between n-channel and p-channel devices. This is accomplished by forming an implant between the devices. In the preferred embodiment, the implant is formed beneath a shallow trench isolation (STI) between the n-channel and p-channel devices. The implant can be formed without requiring additional high energy implants or additional mask levels.

Figure 1:
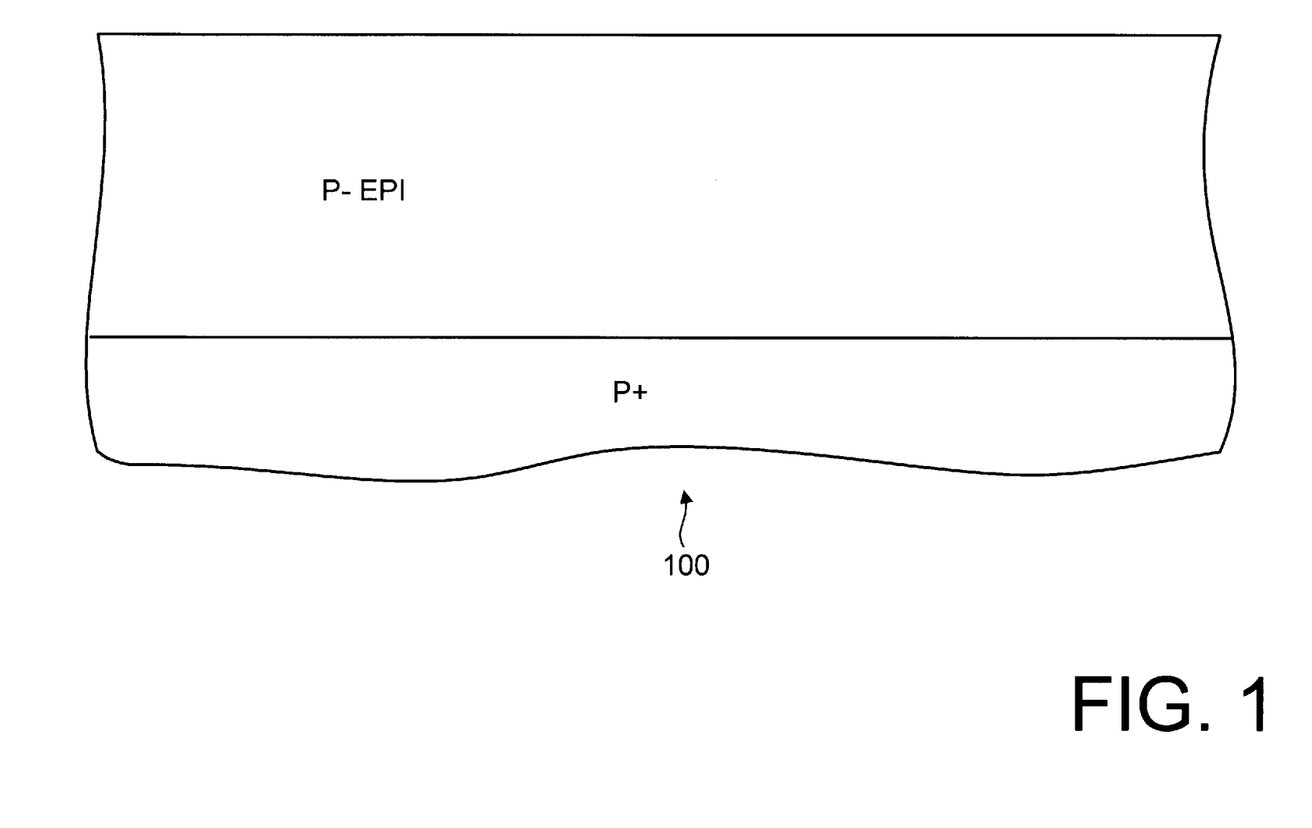
FIG. 1 is a cross sectional side view of a wafer portion.

FIG. 1 is a cross-sectional schematic view of wafer portion 100 on which a CMOS device will be fabricated. In the preferred embodiment, the wafer portion 100 comprises a p+ substrate with a p– epitaxial layer at the top portion. Of course other suitable substrate materials can be used.

Figure 2:
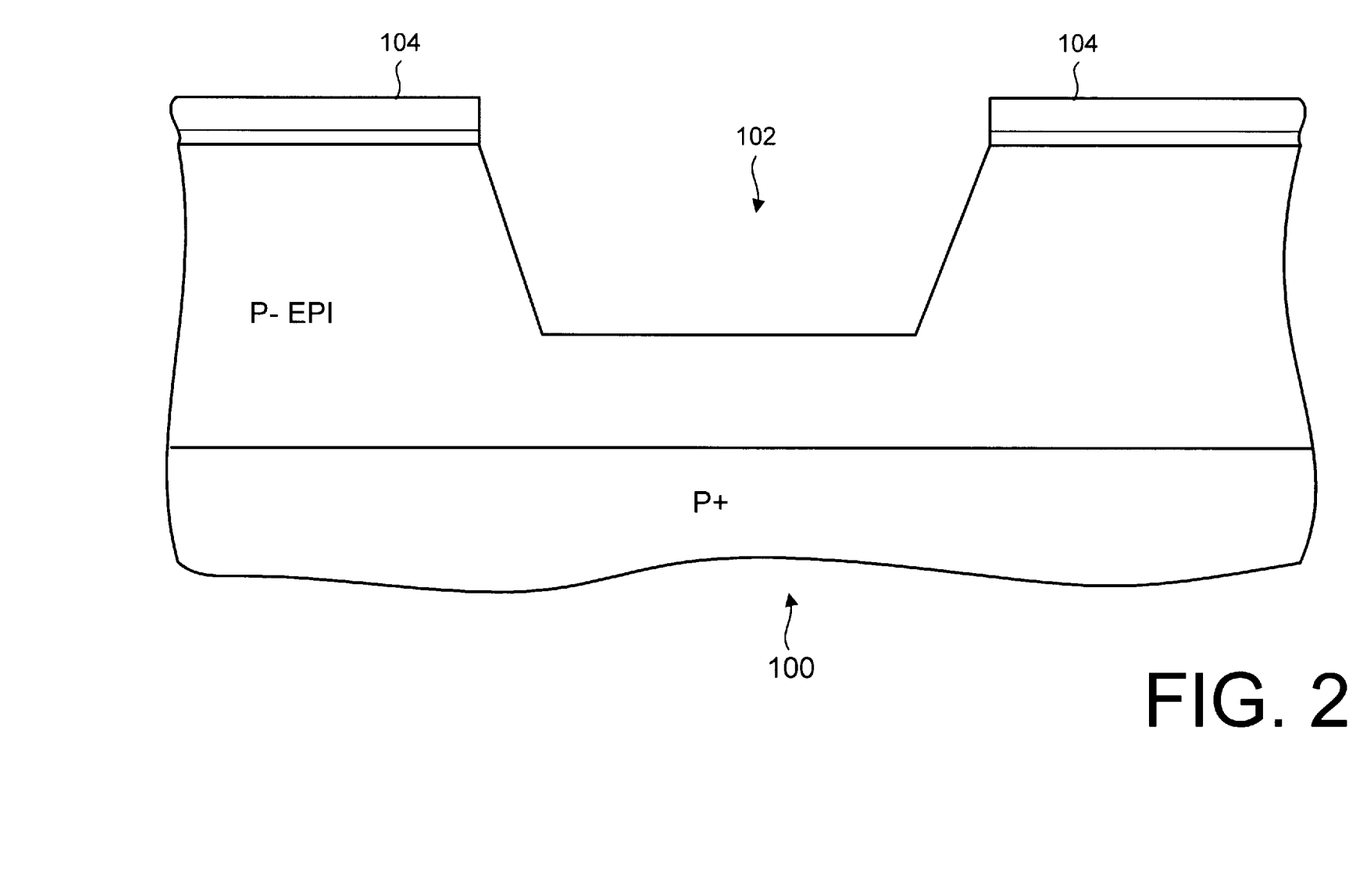
FIG. 2 is a cross sectional side view of a wafer portion with after trench etch for shallow trench isolation.

Turning to FIG. 2, according to the preferred embodiment, shallow trench isolation (STI) 102 is used to separate n-channel from p-channel devices. The STI can be formed with any suitable processing method, such as reactive ion etching (RIE). For example, a masking layer 104 is deposited across the wafer 100. The masking layer can comprise any suitable material, for example, a layer of silicon dioxide ($SiO_2$) under a layer of silicon nitride (SiN) is a commonly used material that may be patterned to form an etch mask. The masking layer 104 is then patterned using conventional photolithography techniques. The STI 102 is then formed by etching away portions of the wafer no longer covered by masking layer 104.

This forms the shallow trench isolation 102. Further processing steps will form n-channel devices and p-channel devices on the wafer portion 100. Isolation regions such as STI 102 are formed between these various devices (i.e., between two n-channel devices, between two p-channel devices and between an n-channel and a p-channel device. In all these cases the STI 102 serves to isolate the devices from each other.

As will become clear, the preferred embodiment results in less mobility for carriers beneath the STI 102 and thus allows the STI 102 to be more shallow than prior art STI's and still maintain effective isolation between devices. Thus, the preferred embodiment improves the scalibility of STI without decreasing the latch-up immunity.

Figure 3:
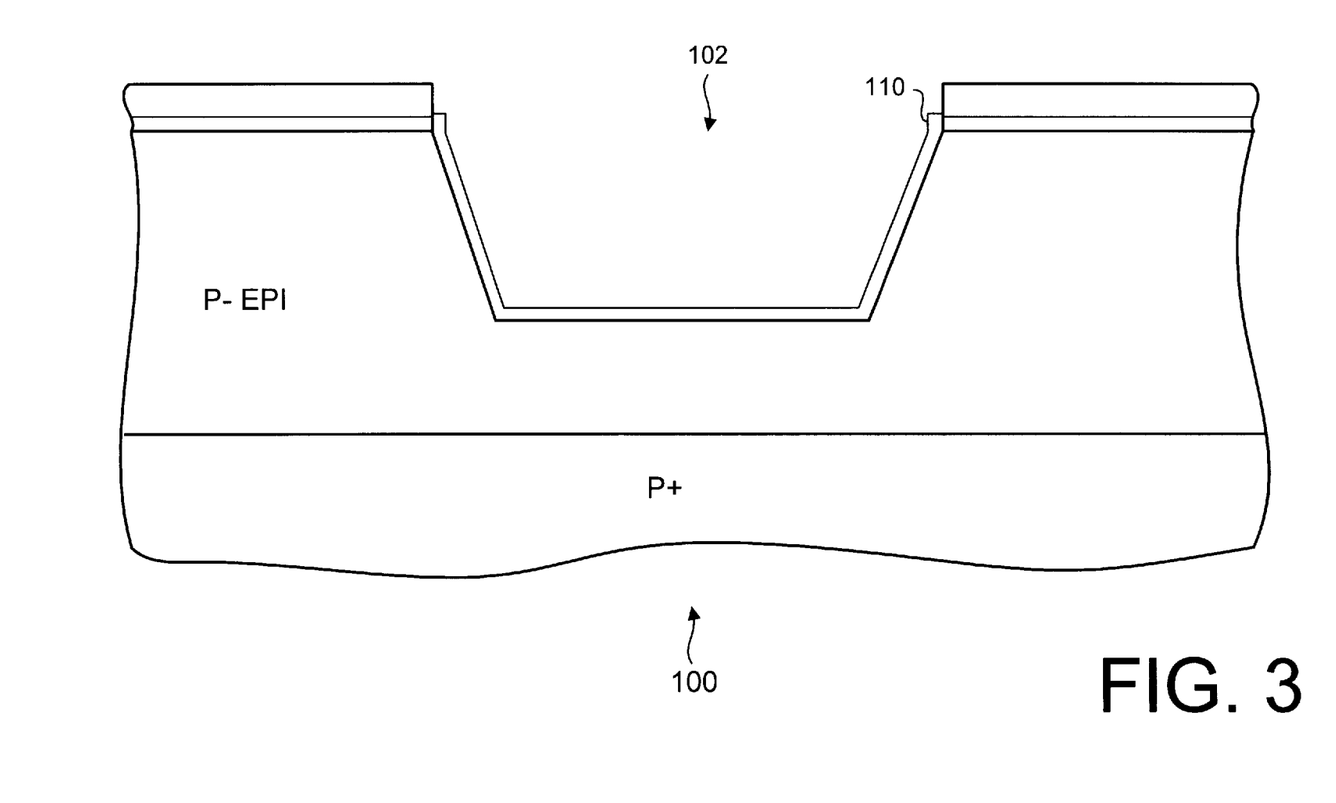
FIG. 3 is a cross sectional side view of a wafer portion with a shallow trench isolation with sidewall oxidation.

Turning now to FIG. 3, the next step is to grow sidewall oxidation 110 (suitably $SiO_2$) in the STI trench. The sidewall oxidation 110 serves to reduce stress incurred by the STI etch and to remove surface contaminants.

According to the preferred embodiment, the latch-up immunity is increased by reducing the mobility of carriers that travel under the STI 102. In particular, an implant or implants are used that improves the latch-up holding voltage. These implants can be made without additional masks.

Figure 4:
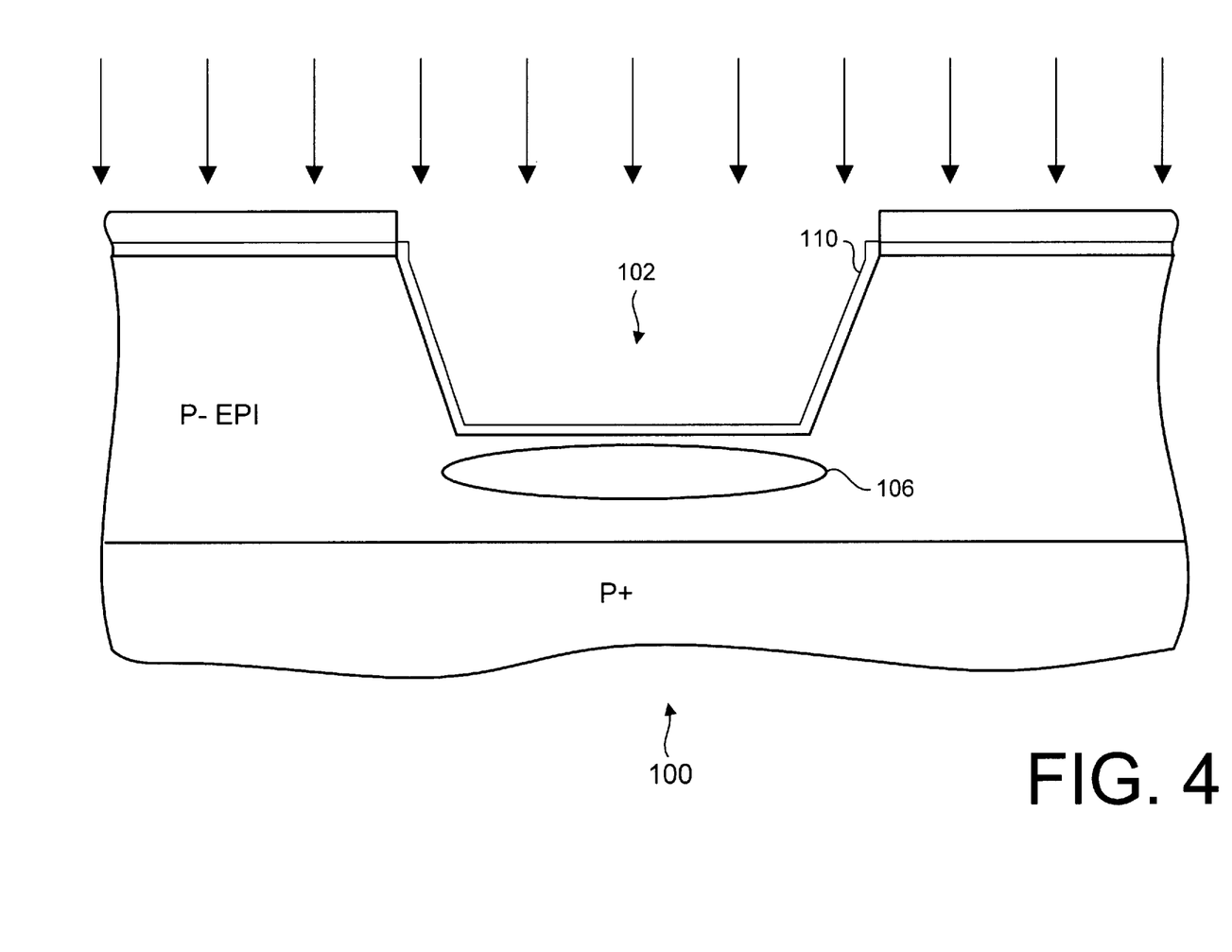
FIG. 4 is a cross sectional side view of a wafer portion with a shallow trench isolation and an implant beneath the shallow trench isolation.

Turning to FIG. 4, a species is implanted forming implant 106 underneath STI 102. The implantation can be done with any suitable procedure, such as traditional ion implantation techniques. The masking layer 104 blocks the implants from entering the other portions of wafer 100. Thus, the implant is self aligned, and does not require additional masks or process steps.

The implants can comprise any suitable material that would sufficiently degrade conductor mobility beneath STI 102. Preferably elements for implants are selected to minimize n-well or p-well counterdoping, and as such the preferred implant would result in minimal doping change for the adjacent n-wells or p-wells. Additionally, the preferred implant should be selected to have low diffusitivity, thus reducing the probability of the implants diffusing into neighboring devices.

Thus, the elements preferably comprise large, heavy elements. Large elements result in an increased probability of scattering, and hence significantly decrease the mobility of the conductors beneath the STI. When latch-up occurs, the current flows almost entirely beneath the STI 102, thus reductions in the mobility beneath the STI 102 will increase the latch-up holding voltage.

The preferred implants can be electrically neutral species, such as argon (Ar), germanium (Ge), oxygen (0), nitrogen (N), and would thus decrease the mobility of carriers with a very low change to the dopant profile of the substrate.

In the alternative, the implants can be p-type and n-type materials used in combination to reduce the mobility while resulting a low net dopant profile changes. In these cases species such as indium (In) in combination with antimony (Sb) and phosphorus (P) in combination with boron (B) can be used. These elements, when implanted under the STI 102 causes the mobility of the carriers beneath the STI 102 to decrease. This increases the latch-up holding voltage and increases latch-up immunity.

Thus, the implants are preferably either a counter doping combination of n-type and p-type materials to minimize effects to neighboring wells, or an electrically inactive species. The implants are preferably implanted at relatively low energies to keep the implants directly under the STI 102.

In an alterative embodiment, the implant 106 is formed before the formation of the sidewall oxidation 110.

Figure 5:
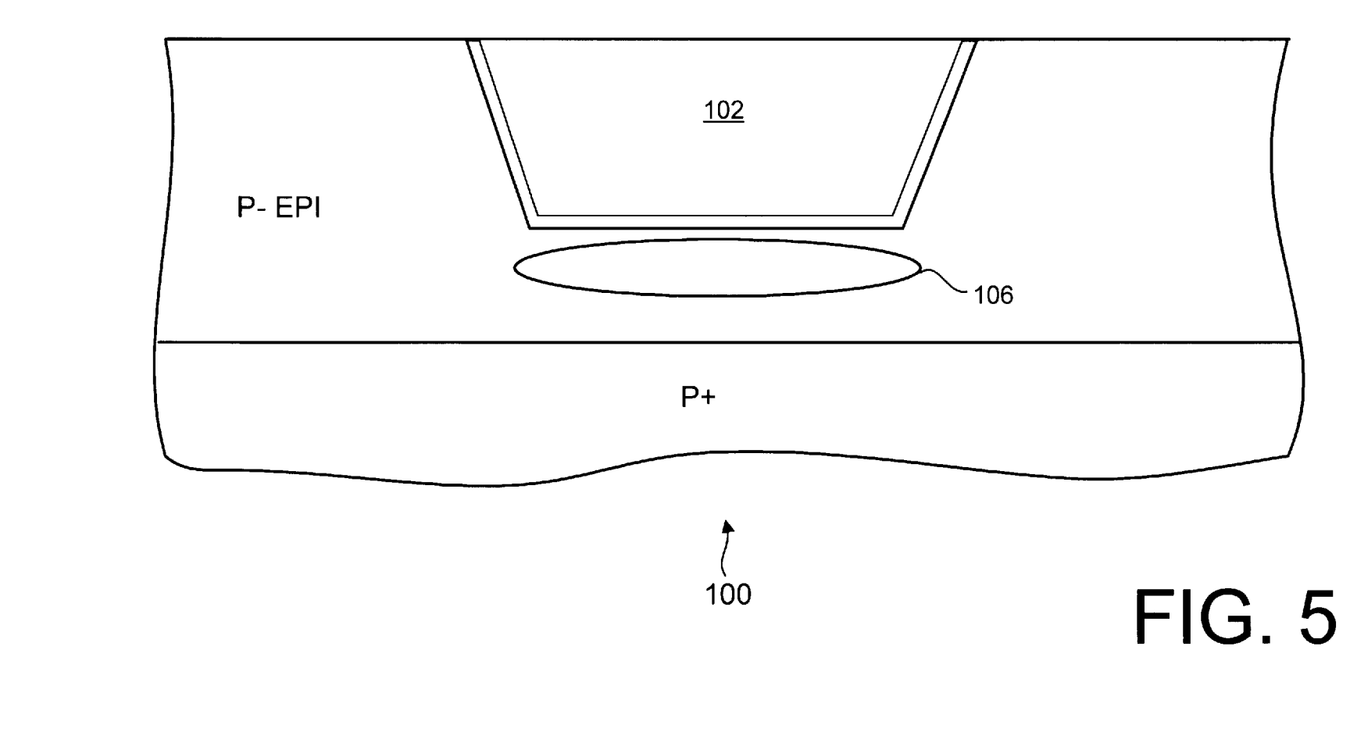
FIG. 5 is a cross sectional side view of a wafer portion with a finished shallow trench isolation and an implant beneath the shallow trench isolation.

Turning now to FIG. 5, the fabrication of the wafer continues. In particular, the STI trench is then filled and the wafer 100 is then planaraized with a chemical mechanical polish (CMP). This removes the remaining masking layer 104 and excess sidewall oxidation, resulting in the finished shallow trench isolation.

Figure 6:
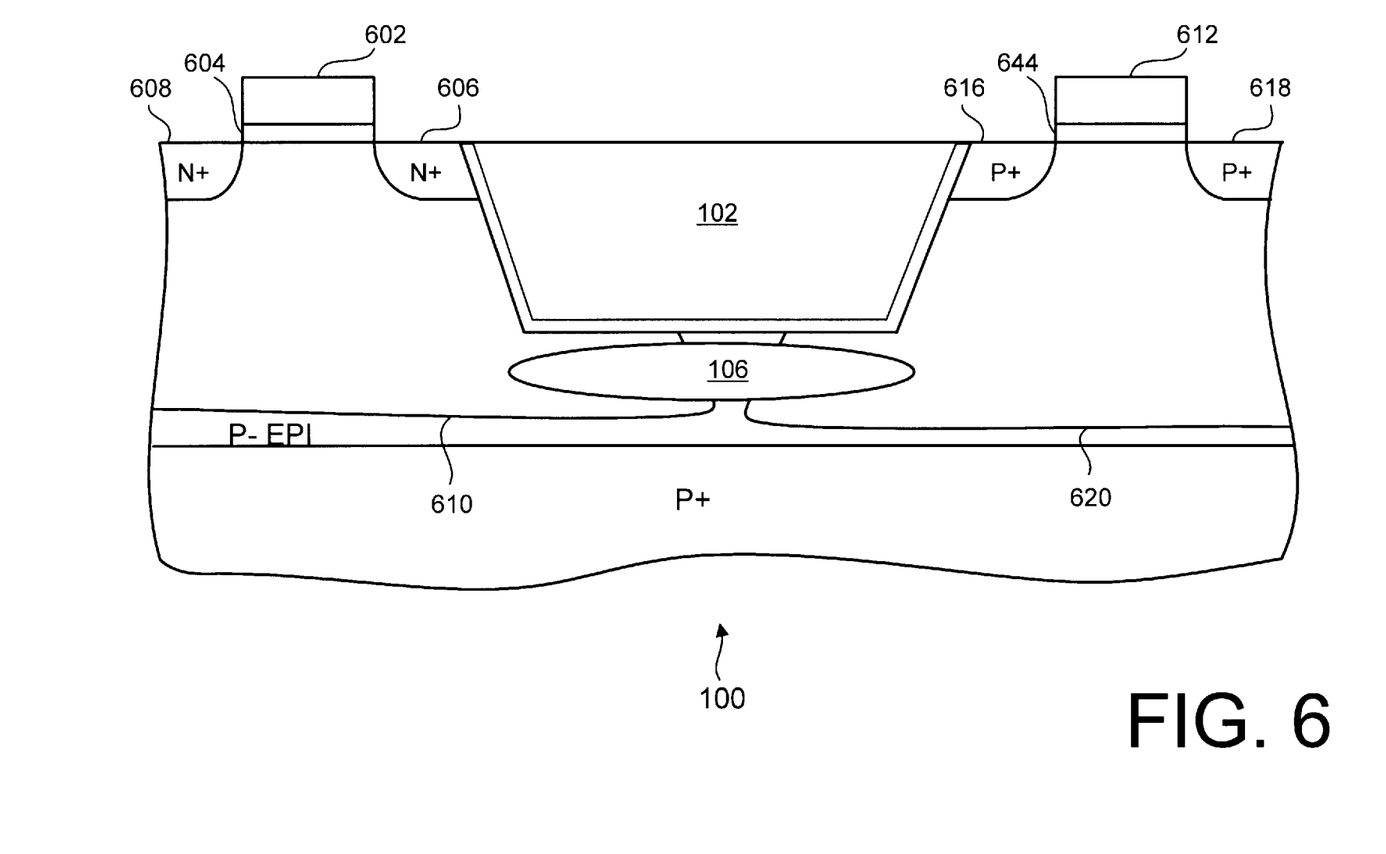
FIG. 6 is a cross sectional side view of a wafer portion with devices fabricated in the n-well and p-well.

The individual devices are now fabricated on both sides of the shallow trench isolation. Turning to FIG. 6, an example of completed devices are shown. In particular, a n-channel device, including a gate 602, gate oxide 604 and diffusions 606 and 608 are formed in the p-well 610. Likewise, a p-channel device including a gate 612, gate oxide 614 and diffusions 616 and 618 are formed in the n-well 620. In accordance with the preferred embodiment, the implant 106 serves to increase the latch-up holding voltage by reducing carrier mobility between the devices. This increases the latch-up immunity of the CMOS devices.

While the invention has been particularly shown and described with reference to a preferred exemplary embodiment with an CMOS device using shallow trench isolation, it will be understood by those skilled in the art that various changes in form and details may be made therein without departing from the spirit and scope of the invention. In particular any type of implant can be made that would reduce the mobility of the carriers beneath the STI.

We claim:

1. A method for reducing the damaging effects of latch-up in CMOS devices comprising the steps of:
   a) providing a semiconductor substrate;
   b) defining a shallow trench in said semiconductor substrate; and
   c) implanting a mobility degrading species below said shallow trench, wherein said mobility degrading species comprises n-type and p-type species in combination to provide a low net dopant profile change in said semiconductor substrate.

2. A method for reducing the damaging effects of latch-up in CMOS devices comprising the steps of:
   a) providing a semiconductor substrate;
   b) defining a shallow trench in said semiconductor substrate; and
   c) implanting a mobility degrading species below said shallow trench, wherein said mobility degrading species comprises a neutral species to provide a low dopant profile change in said semiconductor substrate.

3. A method for reducing the damaging effects of latch-up in CMOS devices comprising the steps of:
   a) providing a semiconductor substrate;
   b) defining a shallow trench in said semiconductor substrate; and
   c) implanting a mobility degrading species below said shallow trench, wherein said mobility degrading species comprises argon.

4. A method for reducing the damaging effects of latch-up in CMOS devices comprising the steps of:
   a) providing a semiconductor substrate;
   b) defining a shallow trench in said semiconductor substrate; and
   c) implanting a mobility degrading species below said shallow trench, wherein said mobility degrading species comprises oxygen.

5. A method for reducing the damaging effects of latch-up in CMOS devices comprising the steps of:
   a) providing a semiconductor substrate;

b) defining a shallow trench in said semiconductor substrate; and c) implanting a mobility degrading species below said shallow trench, wherein said mobility degrading species comprises germanium.

6. A method for reducing the damaging effects of latch-up in CMOS devices comprising the steps of:

a) providing a semiconductor substrate;

b) defining a shallow trench in said semiconductor substrate; and c) implanting a mobility degrading species below said shallow trench, wherein said mobility degrading species comprises nitrogen.

7. A method for reducing the damaging effects of latch-up in CMOS devices comprising the steps of:

a) providing a semiconductor substrate;

b) defining a shallow trench in said semiconductor substrate; and c) implanting a mobility degrading species below said shallow trench, wherein said mobility degrading species comprises indium and antimony.

8. A method for reducing the damaging effects of latch-up in CMOS devices comprising the steps of:

a) providing a semiconductor substrate;

b) defining a shallow trench in said semiconductor substrate; and c) implanting a mobility degrading species below said shallow trench, wherein said mobility degrading species comprises boron and phosphorus.

* * * * *

UNITED STATES PATENT AND TRADEMARK OFFICE
CERTIFICATE OF CORRECTION

PATENT NO. : 5,770,504

DATED : June 23, 1998

INVENTOR(S) : Brown et al.

It is certified that error appears in the above-identified patent and that said Letters Patent is hereby corrected as shown below:

On title page, item [75], the third inventor's name reads "Xiaowei Tlan", the inventor's name should read --Xiaowei Tian--

Signed and Sealed this

Sixth Day of October, 1998

Attest:

BRUCE LEHMAN

Attesting Officer

Commissioner of Patents and Trademarks